US009287084B2

(12) United States Patent
Cheng et al.

(10) Patent No.: US 9,287,084 B2
(45) Date of Patent: Mar. 15, 2016

(54) ABERRATION CORRECTOR AND CHARGED PARTICLE BEAM APPARATUS USING THE SAME

(71) Applicant: Hitachi High-Technologies Corporation, Minato-ku, Tokyo (JP)

(72) Inventors: Zhaohui Cheng, Tokyo (JP); Hideo Kashima, Tokyo (JP); Hiroaki Baba, Tokyo (JP); Takeyoshi Ohashi, Tokyo (JP); Tomonori Nakano, Tokyo (JP); Kotoko Urano, Tokyo (JP); Naomasa Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/607,736

(22) Filed: Jan. 28, 2015

(65) Prior Publication Data

US 2015/0248944 A1    Sep. 3, 2015

(30) Foreign Application Priority Data

Feb. 28, 2014   (JP) ................. 2014-037630

(51) Int. Cl.
*G21K 1/093* (2006.01)
*H01J 3/24* (2006.01)
*H01J 37/153* (2006.01)

(52) U.S. Cl.
CPC ......... *H01J 37/153* (2013.01); *H01J 2237/032* (2013.01); *H01J 2237/1534* (2013.01)

(58) Field of Classification Search
USPC ........... 250/310, 311, 396 R, 396 ML, 492.3, 250/526
See application file for complete search history.

(56) References Cited

U.S. PATENT DOCUMENTS

| 8,207,513 | B2 * | 6/2012 | Sasaki | H01J 37/153 250/492.1 |
| 8,822,913 | B2 * | 9/2014 | Graupera | H01J 37/05 118/723 R |
| 2007/0278416 | A1 | 12/2007 | Kawai | |
| 2009/0039281 | A1 * | 2/2009 | Kawasaki | G01N 23/20 250/396 R |
| 2010/0051806 | A1 * | 3/2010 | Sasaki | H01J 374/153 250/310 |
| 2013/0140450 | A1 * | 6/2013 | Graupera | H01J 37/05 250/282 |
| 2013/0320227 | A1 * | 12/2013 | Urano | H01J 37/153 250/396 R |
| 2015/0129759 | A1 * | 5/2015 | Graupera | H01J 37/05 250/282 |

FOREIGN PATENT DOCUMENTS

| JP | 05-334979 A | 12/1993 |
| JP | 11-339709 A | 12/1999 |
| JP | 2004-241190 A | 8/2004 |
| JP | 2006-139958 A | 6/2006 |
| JP | 2007-287365 A | 11/2007 |
| JP | 2009-043533 A | 2/2009 |
| JP | 2012-209130 A | 10/2012 |

* cited by examiner

*Primary Examiner* — Bernard E Souw
(74) *Attorney, Agent, or Firm* — Miles & Stockbridge P.C.

(57) ABSTRACT

Provided are an aberration corrector that reduces irregularity of a magnetic field of a multipole to obtain an image of high resolution and a charged particle beam apparatus using the same. The aberration corrector includes a plurality of magnetic field type poles, a ring that magnetically connects the plurality of poles with one another and an adjustment member disposed between the pole and the ring to adjust a spacing between the pole and the ring per pole.

15 Claims, 8 Drawing Sheets

F I G . 1
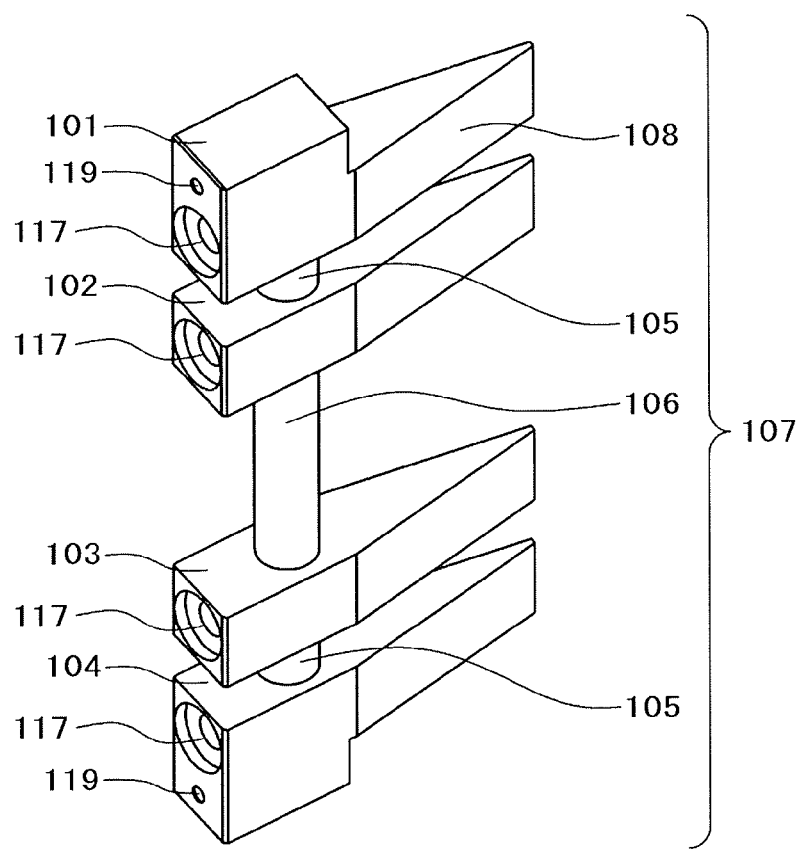

TOP VIEW

CROSS SECTIONAL VIEW

ABERRATION CORRECTOR AND CHARGED PARTICLE BEAM APPARATUS USING THE SAME

CLAIM OF PRIORITY

The present application claims priority from Japanese patent application JP 2014-37630 filed on Feb. 28, 2014, the content of which is hereby incorporated by reference into this application.

BACKGROUND OF THE INVENTION

1. Field of the Invention

The present invention relates to an aberration corrector equipped with a multipole and a charged particle beam apparatus using the above-mentioned aberration corrector.

2. Description of the Related Art

In a microscope, a micromachining apparatus, a semiconductor manufacturing apparatus and so forth configured by practically applying charged particle beams, single-stage or multi-stage multipoles (dipoles, quadrupoles, hexapoles, octupoles and so forth) are used in a deflector and an abberation corrector of beams. Recently, machining with acuracy of about 10 nanometer order or observation with accuracy of sub-nanometer order is performed by using the above-mentioned apparatuses in which the charged particle beams are practically applied and it is desired to control the beams with accuracy of sub-nanometer order. In the deflector and the aberration corrector to be incorporated into the above-mentioned apparatuses in order to implement such control, although, naturally, final adjustment is electrically performed, it is necessary to assemble the multipole with high machine accuracy as a precondition. Hitherto, as a technique for forming the multipole with accuracy, for example, Japanese Patent Application Laid-Open No. H11-339709 discloses a technique that in manufacture of the multipole, a positioning member is set on an optical axis, a pole is pressed against and fixed to the positioning member, and thereafter the positioning member is drawn out. Japanese Patent Application Laid-Open No. H5-334979 discloses a system that a ball-shaped or cylinder-shaped spacer is arranged in a cylindrical housing to position the multiple. Japanese Patent Application Laid-Open No. 2004-241190 discloses a system of fixing individual poles to a base plate with pins and a technique of fixing an integrated pole member and thereafter cutting off each pole by a wire cutter. Japanese Patent Application Laid-Open No. 2009-43533 discloses a system of fixing a multi-stage coupled pole to a base block. Japanese Patent Application Laid-Open No. 2006-139958 discloses a system of forming an electrostatic multipole by using a metal layer disposed on an inner wall of a cylindrical-shape type ceramic cylinder as an electrode. Japanese Patent Application Laid-Open No. 2012-209130 discloses a technology of forming a multipole by fitting a pole member that includes a pole, a support member such as a support and so forth into a groove provided in a cylindrical housing having a through-hole through which charged particles would pass and disposed in parallel with an optical axis direction and then fixing the pole member. Japanese Patent Application laid-Open No. 2007-287365 discloses a technique of bringing a terminus of a pole that configures a magnetic path and a tip of an iron core member into contact with each other with a spacer interposed between the pole and the iron core member.

SUMMARY OF THE INVENTION

As a result of examinations on aberration correction technologies that the inventors have made, it was assumed that it is necessary to assemble the multipole with high machine accuracy in order to control the beams with accuracy of sub-nanometer order, even though the final adjustment is electrically performed, it is necessary to attain the assembling accuracy of micrometer order, in particular, in a spherical aberration corrector and a chromatic aberration corrector, and high assembling accuracy is requested not only in the pole but also in other components that configure the magnetic path in a magnetic field centric type aberration corrector. That is, this is because a parasitic multipolar field which would induce blurring of beams caused by the aberration is generated in addition to a multipolar field that is originally desired for deflection and aberration correction and it becomes necessary to newly perform correction for correcting the aberration and independent fine adjustment of the individual poles becomes necessary. In addition, this is because in the magnetic field centric type aberration corrector, a variation in magnetic resistance at an interface between respective components that configure the magnetic path of each pole leads to an increase in parasitic multipolar magnetic field in correction of the aberration.

Thus, existing ways of assembling multipole members and structures thereof disclosed in the above-mentioned Japanese Patent Application Laid-Open Nos. H11-339709, H5-334979, 2004-241190, 2009-43533, 2006-139958, 2012-209130 and 2007-287365 were examined. As a result, it was found that the related art has the following disadvantages from the viewpoint of attaining both of high accuracy and easiness in assembly.

First, in Japanese Patent Application laid-Open No. H11-339709, when trying to suppress irregularities on the tip of the pole down to not more than about 10 micrometers, it is difficult to draw out the positioning member. In order to draw out the positioning member without damaging the pole tip, it is necessary to provide play between the positioning member and the pole tip, and in particular, the more the number of the poles is increased and the more the number of stages is increased, the more it becomes necessary to increase the play and, as a result, there is given such a disadvantage that it is practically difficult to hold the positioning accuracy within ten micrometers.

The structure described in Japanese Patent Application Laid-Open No. H5-334979 has such a disadvantage that although the ball, the cylindrical spacer and the housing are machined with accuracy, the number of components to be assembled is very increased and much time is taken for assembling the components. In addition, when assembling the plurality of spacers, it is necessary to simultaneously incorporate the spacers into the housing with no space between each spacer and the housing, and it is difficult to retain the spacers and assembling of the spacers is difficult. On the other hand, in order to retain the spacers, when screw holes and so forth are asymmetrically machined in a cylindrical surface of the housing so as to retain the spacers, such a disadvantage arises that it becomes difficult to maintain the accuracy of positioning the spacers. In addition, it is feared that the spacers may be shifted with a vibration which would generate incidentally to transportation.

In the system of fixing the individual poles to the base plate with pins described in Japanese Patent Application Laid-Open No. 2004-241190, there exist two physical amounts to be adjusted for every pole, that is, a distance between the optical axis and the tip of each pole and an azimuth of each pole in a plane vertical to the optical axis. It is necessary to adjust the physical amounts by using at least two pins. Alternatively, the distance between the optical axis and the tip of each pole may be adjusted using one pin and the azimuth may be fixed by a guide. In either case, in order to adjust the distance and the azimuth with accuracy of micrometer order, it becomes necessary to repetitively perform measurement and eccentric machining of the pins, it takes much time and labor and the accuracy is determined depending on the skill of a person who assemblies the poles. Therefore, such a disadvantage arises that this system is poor in reproducibility and is not suited for mass production. In the system of fixing the integrated-type pole member to the base plate and thereafter cutting off each pole by wire cutter machining, the machining accuracy of micrometer order is attained and it is contrived such that a change in magnetic property of the pole caused by cutting-off is limited to a negligible extent. However, since when the base plate and the poles are dissembled after machined, it becomes difficult to maintain the accuracy, cleaning of the parts becomes difficult. Therefore, although this system is suited to manufacture a magnetic field type multipole to be used in an out-of-vacuum state, it is not suited to manufacture an electrostatic type multiple to be used in a vacuum. In addition, it is difficult to form a multi-stage multipole by this method. The reason therefor lies in that since the length of the wire is increased in formation of the multi-stage multipole, it becomes more difficult to assure the accuracy by wire cutter machining. In addition, although positional adjustment of the pole using the above-mentioned positioning pin or guide consequently has influence on spacing between a trailing end of the pole and the through-hole in the cylindrical yoke that forms the magnetic path, it is difficult to perform adjustment of the distance between the optical path and each pole and adjustment of the spacing between the trailing end of the pole and the through-hole in the yoke simultaneously or individually.

In the method described in Japanese Patent Application Laid-Open No. 2009-43533, since the pole is fabricated by wire cutter machining and grinding, the assembling accuracy of micrometer order is readily obtained, the number of components is small and assembling of the poles is easy. However, in the case of the electrostatic multi-stage multipole that it is necessary to use ceramics as the material of the base block, the ceramics base block that has been subjected to high-accuracy grooving is costly and hence this method is disadvantageous in cost.

In the method described in Japanese Patent Application Laid-Open No. 2006-139958, although the multipole of high machine accuracy is formed, there are such disadvantages that charge-up occurs in a ceramics inner wall, an adverse effect of the asymmetric electric field of voltage lead wires arises, and formation of the magnetic field type multipole is difficult.

In the method described in Japanese Patent Application Laid-Open No. 2012-209130, the pole member made of a metal material and the cylindrical housing are included and guide grooves of the number corresponding to that of the poles are formed in inner walls of an upper end and a lower end of the cylindrical housing in parallel with the optical axis. The pole member is inserted into the guide groove while sliding it in the optical axis direction and the pole member is fixed to the cylindrical housing with set screws, thereby forming the multipole. The coupled pole member configured by coupling together the plurality of poles via the support member in the optical axis direction is used as the pole member, thereby forming the multi-stage multipole. In this machining method, the single-stage or multi-stage multipole that is small in number of components and has the assembling accuracy of within about 10 micrometers is obtained. However, when the magnetic field type pole has been used, predominant factors of symmetry of the multipolar field lie in not only the distance between the pole tip and the optical axis and the azimuth of the pole tip but also machining and assembling accuracies of the members other than the poles that form the magnetic path. In the above-mentioned Japanese Patent Application Laid-Open Nos. H11-339709, H5-334979, 2004-241190, 2009-43533, 2006-139958 and 2012-209130, there is no description as to machining and assembling of the members other than the poles that form the above-mentioned magnetic path when the magnetic field type pole member is to be formed. Since the magnetic resistances at the interfaces between the pole and the member other than the pole and between the mutual members other than the pole have influence on the intensity and distribution of the multipolar field on the pole tip, when the variation in magnetic resistance of the magnetic path among the poles in the plane vertical to the optical axis is increased, the intensity of the multipolar field that is parasitic to the multipolar magnetic field to be formed is also increased to induce blurring of the charged particle beams.

In the assembling system described in Japanese Patent Application Laid-Open No. 2007-287365, although the terminus of the pole that configures the magnetic path and the tip of the iron core member are brought into contact with each other with the spacer interposed between them so as to work to reduce the variation in magnetic resistance which would generate at the interface between the magnetic path members of the respective poles, larger excitation current is desired for formation of the multipolar field due to an increase in magnetic resistance. In addition, since the spacer has no adjusting function, it is difficult to absorb the machining tolerance of the constitutional components of the magnetic path and as a result such a disadvantage arises that the parasitic multipolar magnetic field is generated.

The present invention aims to provide an aberration corrector configured to obtain an image of high resolution by reducing irregularity of the magnetic field of a multipole and a charged particle beam apparatus using the aberration corrector so configured.

In view of the above-mentioned circumstances, according to one embodiment of the present invention, there is provided an aberration corrector including a plurality of magnetic field type poles, a ring that magnetically connects the plurality of poles with one another and an adjustment member disposed between the pole and the ring to adjust a spacing between the pole and the ring per pole.

According to another embodiment of the present invention, there is provided a charged particle radiation apparatus including a sample stage, a charged particle source that generates charged particles to be radiated to a sample to be placed on the sample stage, a charged particle beam optical system that radiates the charged particles to the sample as a particle beam and an aberration corrector adapted to correct an aberration of the particle beam, the aberration corrector including a plurality of magnetic field type poles, a ring that magnetically connects the plurality of poles with one another and an adjustment member disposed between the pole and the ring to adjust a spacing between the pole and the ring per pole.

According to the embodiments of the present invention, it is possible to provide the aberration corrector configured to obtain the image of high resolution by reducing irregularity of the magnetic field of the multipole and the charged particle beam apparatus using the aberration corrector so configured.

BRIEF DESCRIPTION OF THE DRAWINGS

FIG. 1 is a perspective view illustrating one example of a four-pole-coupled pole member (a pole member configured by coupling four poles) in an aberration corrector according to a first embodiment of the present invention.

DETAILED DESCRIPTION OF THE PREFERRED EMBODIMENTS

Figure 2:
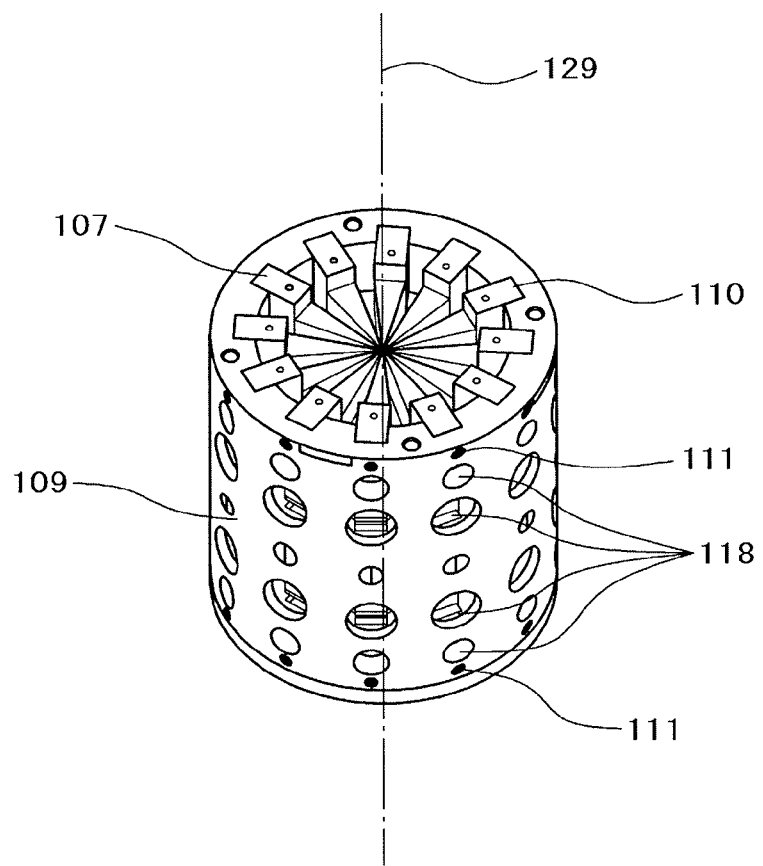
FIG. 2 is a perspective view illustrating one example of a 12-pole 4-stage unit that has been incorporated into a cylindrical housing in the aberration corrector according to the first embodiment of the present invention.

As a result of examination of existing aberration correctors, the inventors found that in a part of the groove or the hole formed in the magnetic path ring into which each multipole is to be housed, a distance between a side face of the groove or the hole and a side face of the pole is varied among the poles and the magnetic resistance between the magnetic path ring and each pole is varied among the poles. The present invention has been made on the basis of the above-mentioned new knowledge.

In the following, embodiments of the present invention will be described with reference to the drawings. Incidentally, although in the embodiments, description will be made on a apparatus using electron beams, the present invention is also applicable to a apparatus using proton beams. In addition, the same numerals are assigned to the same parts in the following drawings and repetitive description thereof will be made as necessary.

First Embodiment

A first embodiment of the present invention will be described by using FIG. 1 to FIG. 7. First, one example of a 12-pole 4-stage chromatic and spherical aberration corrector will be described as one example of the aberration corrector by using the plurality of drawings.

FIG. 1 is a diagram schematically illustrating one example of a four-pole-coupled pole member 107 that is one of elements of a 12-pole 4-stage unit that is a central part of the chromatic and spherical aberration corrector according to the present embodiment. Incidentally, although the pole includes a front stage part pole and a rear stage part pole, the front stage part pole and/or the rear stage part pole will be simply called the pole in some cases here. The poles ranging from a front stage part pole 101 to a front stage part pole 104 may be made of a soft magnetic metal such as permalloy, pure iron, permendur and so forth or both of the soft magnetic metal material and a non-magnetic metal material. These four poles 101, 102, 103 and 104 are integrated together by brazing via alumina supports 105 and 106 to form the four-pole-coupled pole member 107. After the four-pole-coupled pole member 107 has been formed, the four poles 101, 102, 103 and 104 are finished by simultaneous machining to make the angles of inclined planes 108 of tip parts of the poles 101, 102, 103 and 104 uniform. Since twelve four-pole-coupled pole members 107 are finished by using the same jig and under the same machining condition, it becomes possible to form the four-pole-coupled pole members 107 of the same shape with accuracy of micrometer order. Incidentally, reference numeral 117 denotes a pole attaching hole and reference numeral 119 denotes a pole member fixing threaded hole.

FIG. 2 is an outside view illustrating one example of the 12-pole 4-stage unit that the four-pole-coupled pole members 107 illustrated in FIG. 1 have been incorporated into a cylindrical housing 109. Twelve square grooves 110 are formed in inner wall parts of the both ends of an opening of the cylindrical housing 109 on the inner circumferential side. Twelve poles are assembled by fitting the 4-pole-coupled pole members 107 into the square grooves 110 in the cylindrical housing 109 while directing acute angle parts of the inclined planes 108 of the 4-pole-coupled pole members 107 toward the optical axis 129 side and sliding the 4-pole-coupled pole members 107 in the optical axis 129 direction. The first stage pole 101 and the fourth stage pole 104 have the pole member fixing threaded holes 119 and are fixed to the cylindrical housing 109 with screws 111 through holes formed in the square grooves 110. The cylindrical housing 109 is made of the non-magnetic metal and the square grooves 110 formed in the both end parts of the circular opening formed through the cylindrical housing 109 from its upper surface to its lower surface are formed such that the first stage pole 101 and the fourth stage pole 104 of each 4-pole-coupled pole member 107 are fitted into the grooves 110. The thickness of a side wall of the cylindrical housing 109 where the second stage pole 102 and the third stage pole 103 are to be arranged is made thin such that the second stage pole 102 and the third stage pole 103 are not brought in contact with the cylindrical housing 109. Incidentally, also a single-stage multipole may be formed by using a single-body metal pole as the pole member and a spacer of a thickness corresponding to that of the one-stage pole as the housing. Reference numeral 118 denotes a rear stage part pole through-hole.

Figure 3:
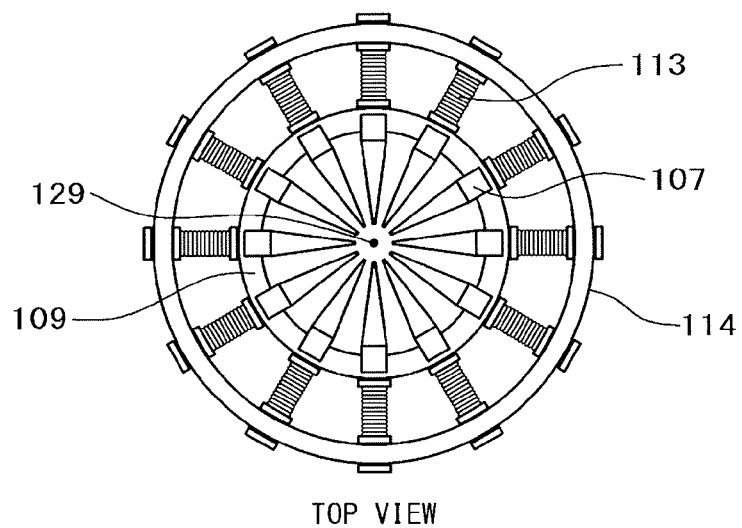
FIG. 3 is diagrams illustrating one example of the aberration corrector (a chromatic and spherical aberration corrector) according to the first embodiment of the present invention, wherein an upper diagram is a top view and a lower diagram is a partial sectional view.
Figure 3:
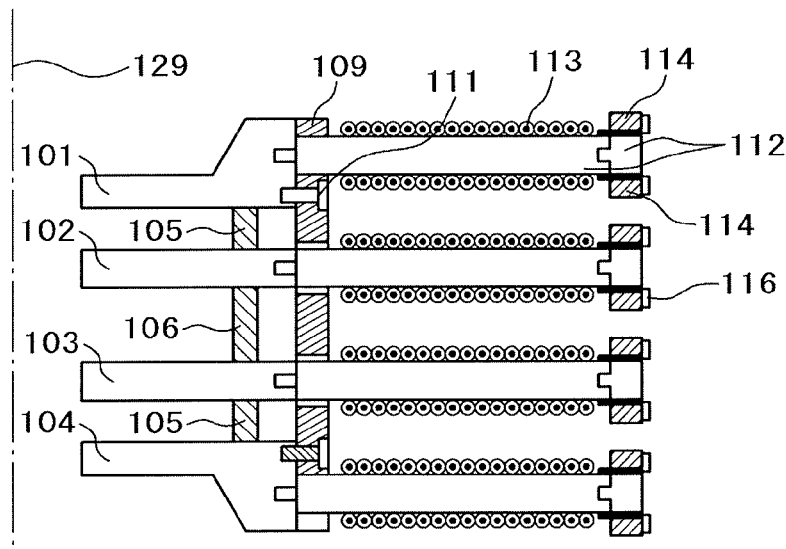

FIG. 3 is a diagram illustrating one example of a structure of the chromatic and spherical aberration corrector that coils 113 and an outer magnetic path ring (a magnetic yoke) 114 have been attached to the 12-pole 4-stage unit described in FIG. 2 that is a base. Projected parts on tips of respective rear stage part poles 112 are fitted into rear stage part pole attaching holes 117 in the front stage part poles 101, 102, 103 and 104 through the through-holes 118 formed in the side wall of the cylindrical housing 109, thereby attaching the rear stage part poles 112 to the ends of the respective front stage part poles. Incidentally, the rear stage part pole 112 is made of the soft magnetic metal material or both of the soft magnetic metal material and the non-magnetic metal material and the coil 113 is wound on the pole 112. A hole 115 used for fixing each rear stage part pole 112 is formed in the outer magnetic path ring 114 and the magnetic path is formed by coupling together the above-mentioned rear stage part pole 112 and the outer magnetic path ring 114 through the hole 115. The magnetic path is formed per stage of the multipole in this way. An insulating sleeve 116 has a space adjusting function of adjusting a spacing between a side wall of the above-mentioned rear stage part pole 112 and an inner wall of the hole 115 in the outer magnetic path ring 114 such that the distance of the spacing is made uniform in a circumference direction of the side wall of the above-mentioned rear stage part pole 112 and is attached between the rear stage part pole 112 and the outer magnetic path ring 114. The outer magnetic path ring 114 is grounded and the second and third rear stage part poles 112 are insulated from the outer magnetic path ring 114 because also electric fields are to be applied to the second and third rear stage poles 112. Since it is not necessary to insulate the first and fourth rear stage poles 112 to which no electric field is applied from the outer magnetic path ring 114, the first and fourth rear stage poles 112 may be also configured as components having the space adjusting function.

Chromatic aberration correction is performed by exciting a quadrupole magnetic field in each of the first, second, third and fourth stage poles and exciting a quadrupole electric field that is 45° out of phase with the above-mentioned quadrupole magnetic field in each of the second and third stage poles simultaneously. Spherical aberration correction is performed by exciting an octupole magnetic field in each of the first, second, third and fourth stage poles. Since it is difficult to mechanically array the respective multipoles relative to the optical axis with accuracy of nanometer order when correction is to be actually performed, a dipole field (acting as a deflector) is excited in each stage pole and the respective poles so excited are superimposed to electrically adjust such that the beam passes through the center of the quadrupole field in each stage pole. In addition, correction of three-fold astigmatism and on-axis coma aberration is performed by exciting a hexapole field in each stage pole.

Next, details of the insulating sleeve 116 having the above-mentioned space adjusting function of adjusting the distance of the spacing between the side wall of the above-mentioned rear stage part pole 112 and the inner wall of the hole 115 in the outer magnetic path ring 114 and an adjusting method performed by the insulating sleeve 116 will be described.

Figure 4:
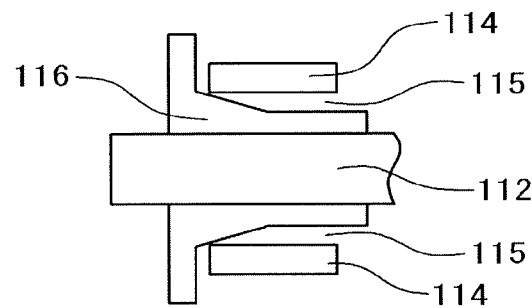
FIG. 4 is a sectional diagram illustrating one example (Example 1) of a mechanism adapted to adjust a spacing between facing surfaces of a rear-stage part pole and an outer magnetic path ring in the 12-pole 4-stage unit of the aberration corrector according to the first embodiment of the present invention.

FIG. 4 is a diagram illustrating one example of a mechanism for adjusting the spacing between facing surfaces of the side wall of the rear stage part pole 112 and the inner wall of the hole 115 in the outer magnetic path ring 114. A tapered structure is prepared for the insulating sleeve 116 having the space adjusting function to be interposed in the spacing between the side wall of the above-mentioned rear stage part pole 112 and the inner wall of the hole 115 in the outer magnetic path ring 114 and the insulating sleeve 116 having the space adjusting function is pressed toward a direction of the outer magnetic path ring 114 (a rightward direction in FIG. 4) such that a spacing caused by machining tolerance is distributed uniformly around the side wall of the aforementioned rear stage part pole 112, thereby fixing the pole 112 and the ring 114. Incidentally, the influence of deformation of the rear stage part pole 112 caused by squeezing in positional adjustment is not exerted up to the tip of the front stage part pole.

Figure 5:
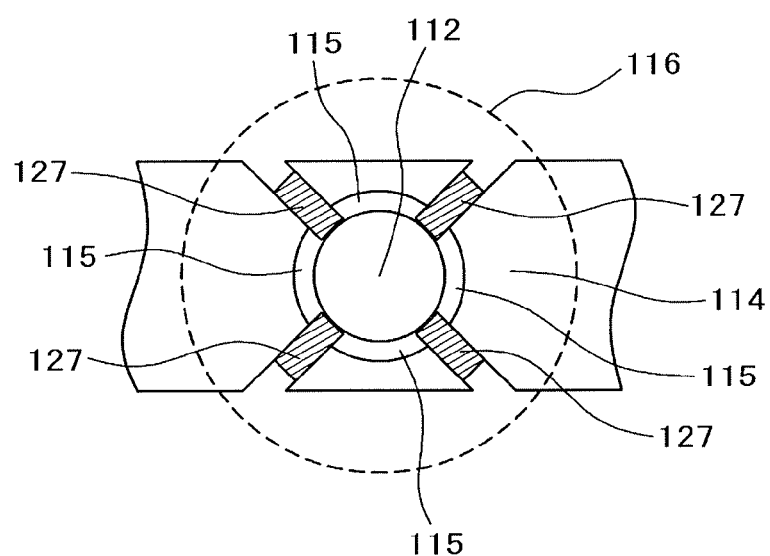
FIG. 5 is a sectional diagram illustrating another example (Example 2) of the mechanism adapted to adjust the spacing between the facing surfaces of the rear-stage part pole and the outer magnetic path ring in the 12-pole 4-stage unit of the aberration corrector according to the first embodiment of the present invention.

FIG. 5 is a diagram illustrating another example of the mechanism for adjusting the spacing between the facing surfaces of the side wall of the rear stage part pole 112 and the inner wall of the hole 115 in the outer magnetic path ring 114. Incidentally, FIG. 5 corresponds to a sectional diagram obtained, for example, when observing FIG. 4 from the right side. A plurality of threaded holes (here, four threaded holes per pole) are formed in the outer magnetic path ring 114 toward the center of the hole 115 corresponding to each rear stage part pole 112, the rear stage part pole 112 is installed in the hole 115, thereafter at least one or more adjustment screws 127 are screwed into the aforementioned threaded holes, and the position of each adjustment screw 127 is adjusted such that the aforementioned spacing is distributed uniformly around the side wall of the aforementioned rear stage part pole 112, thereby fixing the pole 112 and the ring 114. Incidentally, although in the present embodiment, the hole 115 has been formed in the outer magnetic path ring 114, a groove may be formed instead. In addition, in the configuration described above, the screw 127 has insulation property. In addition, the influence of deformation of the rear stage part pole 112 caused by squeezing in positional adjustment is not exerted up to the tip of the front stage part pole.

Figure 6:
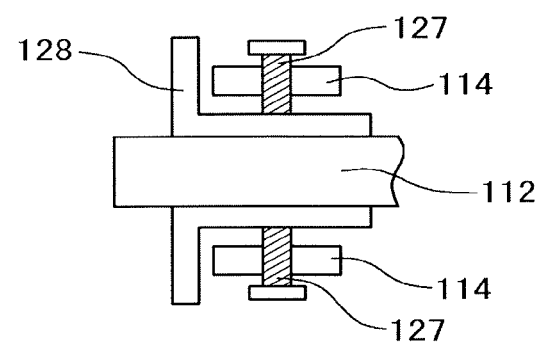
FIG. 6 a sectional diagram illustrating a further example (Example 3) of the mechanism adapted to adjust the spacing between the facing surfaces of the rear-stage part pole and the outer magnetic path ring in the 12-pole 4-stage unit of the aberration corrector according to the first embodiment of the present invention.

FIG. 6 is a diagram illustrating a third example of the mechanism for adjusting the spacing between the facing surfaces of the side wall of the rear stage part pole 112 and the inner wall of the hole 115 in the outer magnetic path ring 114. An insulating sleeve (a spacer made of a non-magnetic body) 128 is interposed in advance between the side wall of the rear stage part pole 112 and the inner wall of the hole 115 in the outer magnetic path ring 114, and the spacing between the side wall of the rear stage part pole 112 and the inner wall of the hole 115 in the outer magnetic path ring 114 is adjusted by using the adjustment screws 127 so as to distribute uniformly in the direction of the side wall of the rear stage part pole 112, thereby fixing the pole 112 and the ring 114. Incidentally, the influence of deformation of the rear stage part pole 112 caused by squeezing in positional adjustment is not exerted up to the tip of the front stage part pole.

Although in the present embodiment, when adjusting the spacing by using the adjustment mechanisms described with reference to FIG. 4 to FIG. 6, the spacing has been adjusted while directly measuring the distribution of the spacing in the side wall direction of the rear stage part pole 112 as mentioned before, a monopole magnetic field may be generated by making excitation current flow toward the pole to be subjected to positional adjustment so as to adjust the spacing while measuring magnetic characteristics (the magnetic field intensity and direction in the bore of the multipole). For example, adjustment is performed by using the adjustment mechanism such that the magnetic field intensity in the bore of the multipole is minimized, thereby determining a positional relation between the rear stage part pole 112 and the hole 115 in the outer magnetic path ring 114.

As described above, it became possible to obtain the single-stage or multi-stage aberration corrector by which the assembling accuracy of within ten micrometers is obtained by adopting the member for adjusting the spacing between the pole and the groove or through-hole in the cylindrical yoke that configures the magnetic path.

Figure 7:
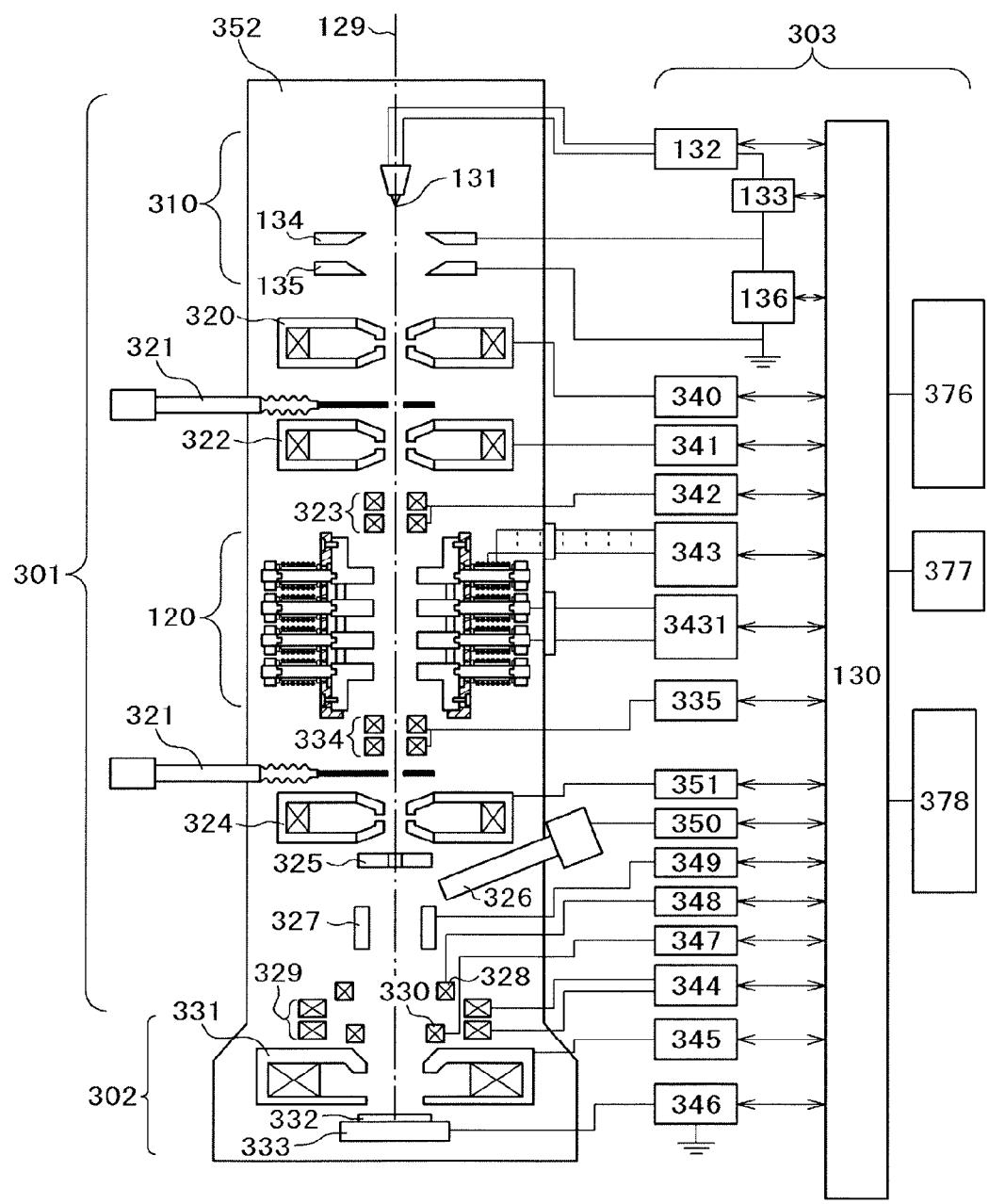
FIG. 7 is a schematic configuration diagram (a partial sectional diagram) illustrating one example of a charged particle beam apparatus (a scanning electron microscope with the chromatic and spherical aberration corrector loaded) according to the first embodiment of the present invention.

Next, a charged particle beam apparatus using the aberration corrector according to the present embodiment will be described by using FIG. 7. FIG. 7 is a diagram illustrating one example that the chromatic and spherical aberration corrector illustrated in FIG. 3 has been put into a vacuum container and incorporated into a scanning electron microscope (hereinafter, referred to as an SEM). The SEM includes an SEM column 301 that makes electron beams radiate onto or scan over a sample, a sample chamber 302 in which a sample stage is to be housed, a control unit 303 adapted to control respective constitutional components of the SEM column 301 and the sample chamber 302 and so forth. Here, illustration and description of an ion pump, a turbo-molecular pump, vacuum piping and a vacuum system control mechanism are omitted. Further, a data storage 376 adapted to store predetermined information, a monitor 327 adapted to display an acquired image, and an operation console 378 to serve as an interface between the apparatus and a user of the apparatus are connected to the control unit 303. The operation console 378 includes information input units such as, for example, a keyboard, a mouse and so forth.

First, constitutional elements in the SEM column 301 will be described. A field emission electron source 131 is an electron source formed by sharpening the tip of a tungsten single crystal by electric field assisted polishing and is conducted and heated by a flashing power source 132 to clean its surface, thereafter a voltage of about +5 kV is applied between the electron source 131 and an extraction electrode 134 by an extraction power source 133 in an ultra-high vacuum of about $10^{-8}$ Pa to emit field-emission electrons. The electrons that have been accelerated and converged by an electrostatic lens formed between the extraction electrode 134 and a second anode 135 are incident upon a rear stage constitutional element along the optical axis 129. Then, the electrons are converged by a first condenser lens 320, restricted in beam amount by a movable aperture 321, pass through a second condenser lens 322 and a two-stage deflector 323 and are incident upon an aberration corrector 120. The two-stage deflector 323 is adjusted such that axes of a field emission electron gun 310 and the condenser lenses 320 and 322 and an axis of the aberration corrector 120 align with one another. The beam output from the aberration corrector 120 is adjusted so as to align with optical axes of an adjustment lens 324 and an objective lens 331 by a two-stage deflector 334. In addition, though it depends on the setting condition of the first condenser lens 320, installation of the second condenser lens 322 may not necessarily be desired.

Next, the operation of the aberration corrector 120 will be described. The aberration corrector 120 of the present embodiment is a quadrupole/octupole aberration corrector and is capable of correcting a chromatic aberration and a spherical aberration. Although the quadrupole and the actupole are formed at the respective stages of the aberration corrector 120, it is also possible to form a dipole, a hexapole and a twelve-fold pole in superimposition by using a magnetic pole (may also serve as an electrode) including twelve poles in addition to the quadrupole and the octupole. Multipolar fields of the above-mentioned poles are used in order to correct parasitic aberrations caused by errors in assembling the electrodes and the magnetic poles and heterogeneity of magnetic pole materials such as, for example, the on-axis comma aberration, the three-fold astigmatism, four-fold astigmatism and so forth.

The electron beam whose angle according to yawing equivalent to cancellation of the chromatic aberration and the spherical aberration, mainly, of the objective lens 331 has been adjusted by the aberration corrector 120 is once focused onto the vicinity of an E×B deflector 327 by the adjustment lens 324. A crossover is formed in the vicinity of the E×B deflector 327 in order to reduce the influence of the aberration of the E×B deflector 327. An increase in fourth-order chromatic and spherical combined aberration and an increase in fifth-order spherical aberration which would occur after correction of the chromatic aberration and the spherical aberration are also suppressed by the adjustment lens 324. Therefore, it is necessary to install the adjustment lens 324 in order to obtain the image of high resolution by aberration correction. Then, the electron beam is focused onto a sample 332 by the objective lens 331 and is scanned over the sample by a scanning deflector 329. Reference numeral 328 denotes an objective aligner.

A sample stage 333 with a sample placing face on which the sample 332 is to be placed is housed in the sample chamber 302. Secondary charged particles (in this case, secondary electrons or reflected electrons) that are generated by electron beam irradiation pass through the objective lens 331, strike against a reflector 325 to generate subsidiary particles. The generated electrons are detected by a secondary electron detector 326. The E×B deflector 327 bends the orbit of secondary electrons generated from the sample 332 and guides the secondary electrons directly to the secondary electron detector 326 or adjusts the position where the secondary electrons generated from the sample 332 strike against the reflector 325 to improve detection efficiency. A detected secondary electron signal is fetched into a control computer 130 as a luminance signal that is in synchronization with scanning. The control computer 130 performs appropriate processing on fetched luminance signal information and the information so processed is displayed on a monitor 377 as an SEM image. Although only one detector is illustrated here, the plurality of detectors may be arranged so as to acquire an image by selecting energy and angle distributions of the reflection electrons and the secondary electrons. When a coaxial disc-shaped secondary electron detector with a hole formed in the center is arranged on the optical axis 129, installation of the reflector 325 may not necessarily be desired.

The control unit 303 includes the flashing power source 132, the extraction power source 133, an acceleration power source 136, a first condenser lens power source 340, a second condenser lens power source 341, an adjustment lens power source 351, a deflector power source 342, an aberration correction coil power source 343, an aberration correction voltage source 3431, a scanning coil power source 344, an objective lens power source 345, a retarding power source 346, an astigmatism correction coil power source 347, an objective aligner power source 348, an E×B deflector power source 349, a secondary electron detector power source 350 and so forth, and these power sources are connected with their corresponding constitutional elements in the SEM column via signal transmission lines, electric wiring and so forth. Incidentally, reference numeral 330 denotes an astigmatism correction coil and reference numeral 335 denotes a deflector power source.

A vacuum container 352 is made of the soft magnetic metal such as permalloy and so forth because it also serves as a magnetic shield, or made of the non-magnetic metal and the magnetic shield is formed on its surface with a permalloy thin sheet. A coil power source is connected to the aberration corrector 120 so as to form the quadrupoles and the actupoles at the respective stages. Alternatively, coils for quadrupole formation and actupole formation may be wound separately as the coil 113. In this case, a quadrupole coil power source and an actupole coil power source are independently prepared. When the coils are not separately wound, the control computer 130 calculates an output current from a coil power source of each pole such that one coil power source corresponds to each pole to form the quadrupole field and the actupole field and controls the aberration correction coil power source 343 to output the current as calculated. In addition, also voltages to be applied to the second and third stage poles are calculated by the control computer 130 similarly and are output from the aberration correction voltage source 3431.

In order to determine an aberration adjustment amount of the aberration corrector 120, it is necessary to measure the aberration of a system before performing aberration correction. For this purpose, the aberration may be measured by moving the beam by the two-stage deflector 323 around the optical axis of the aberration corrector at a fixed azimuth (for example, dividing into twelve angles of about 30° each) and analyzing the SEM image in each case. Data on the plurality of SEM images is fetched into the control computer 130 and the aberration is calculated. Next, the control computer 130 calculates the outputs from the aberration correction coil power source 343 and the aberration correction voltage source 3431 so as to cancel the calculated aberration and issues commands to these power and voltage sources 343 and 3431 to correct the aberration. The control computer 130 again measures the aberration, calculates again the aberration correction amount on the basis of the measured value and controls the power and the voltage sources 343 and 3431 to output the power and voltage. When this process is manually or automatically repeated several times and all aberration amounts of the system reach values that are not more than previously set threshold values, aberration correction is completed. It is known that it is possible to reduce the influence of the fifth-order aberration by projecting an image on a principal plane of the fourth stage pole of the aberration corrector 120 on a principal plane of the objective lens 331 as one of setting condition of the adjustment lens 324. Since the influence of the fifth-order aberration is greatly changed in reality in equilibrium with a divergence angle of the beam, it is not necessary to operate the adjustment lens 324 strictly under that condition and it may be operated under a condition close to the above condition.

According to the present embodiment, it is possible to implement the multipole aberration corrector with the assembling accuracy of within about 10 micrometers and within several seconds in angle with respect to irregularities of the bore of the multipole, nonuniformity of the spacing between the pole and the outer magnetic path ring, the angles including the azimuth of each pole and so forth. This is because since it is possible to machine the shapes of the pole, the guide groove and the outer magnetic path ring with the machine accuracy of several micrometers by wire cutter machining and grinding, it is sufficiently possible to obtain the aforementioned assembling accuracy by combining the above-mentioned machining and grinding.

In addition, since the spacing between the pole and the outer magnetic path ring is adjusted while measuring the magnetic field intensity of the bore part (the pole tip) of the multipole when assembling the poles, it is possible to implement the magnetic symmetry of the multipole to the maximum extent.

In addition, since as the basic components used to form the multipole, only the poles, the cylindrical housing and the set screws are used and there is no portion to be adjusted, when assembling the multipole, it becomes possible to assemble the multipole not depending on the skill of the worker, in a short time, with high reproducibility and with almost no machine difference.

In addition, when attaching the outer magnetic path ring, since the spacing between the pole and the outer magnetic path ring is adjusted while measuring the magnetic field characteristics (the direction and the intensity of the magnetic field) of the bore part of the multipole, it is possible to provide the aberration corrector making it possible to surely minimize the variation in magnetic characteristics among the multipoles.

In addition, since the number of constitutional components of the multipole is small and the multipole is simple in structure, it is possible to provide the stable charged particle beam apparatus with no backlash of the poles which would occur with vibration when transporting the apparatus and with heat generated from the coil.

In addition, since auxiliary poles are fabricated under the same machining condition when fabricating the poles, it is possible to readily perform maintenance work such as replacement of the pole when the pole has been damaged.

In addition, since also shifting in azimuth among the multi-stage multipoles is suppressed in structure, it is possible to provide an electron optical apparatus of high performance.

As described above, according to the present embodiment, it is possible to provide the aberration corrector that is reduced in irregularity of the magnetic field of the multipole, makes it possible to obtain a fine charged particle ray beam diameter and makes it possible to obtain the image of high resolution, and the charged particle beam apparatus using the above-mentioned aberration corrector.

Second Embodiment

One example of an aberration corrector according to a second embodiment of the present invention will be described by using FIG. 8 and FIG. 9. Incidentally, it is also possible to apply the matters described in the first embodiment and not described in the present embodiment to the present embodiment unless there are special circumstances.

Figure 8:
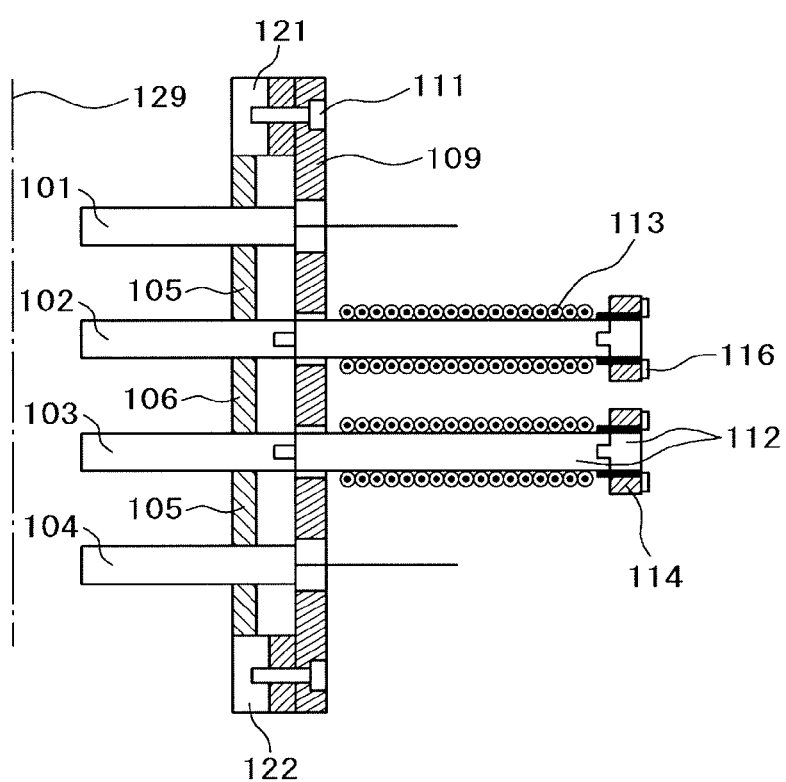
FIG. 8 is a partial sectional diagram illustrating one example of a structure of an aberration corrector (a chromatic and spherical aberration corrector) according to a second embodiment of the present invention.

FIG. 8 is a diagram illustrating one example of a chromatic and spherical aberration corrector according to the present embodiment mainly including a 12-pole 4-stage electric field quadrupole. Since, in this case, it is necessary to insulate all of the poles of four stages, metal fittings 121 and 122 used for fixing to the grooves 110 are added to upper and lower parts of each of the four poles as brazing pole members. Thereby, all of the four poles are insulated from the cylindrical housing 109. The first stage pole 101 and the fourth stage pole 104 are connected to only the voltage source, the second and third stage poles 102 and 103 are electromagnetic field composite type poles and the coil 113 for magnetic field generation is arranged on the inner side of the outer magnetic path ring 114. The outer magnetic path ring 114 is coupled to the rear stage part pole 112 via the insulating sleeve 116 having the space adjusting function. The magnetic field that has passed through the pole runs around within the outer magnetic path ring 114 to form a magnetic circuit. The second and third stage poles 102 and 103 are insulated also from the outer magnetic path, a mirror body and other poles via the insulating sleeve 116 having the space adjusting function. There is formed the chromatic and spherical aberration corrector mainly including the electric field quadrupole in the above-mentioned manner.

Figure 9:
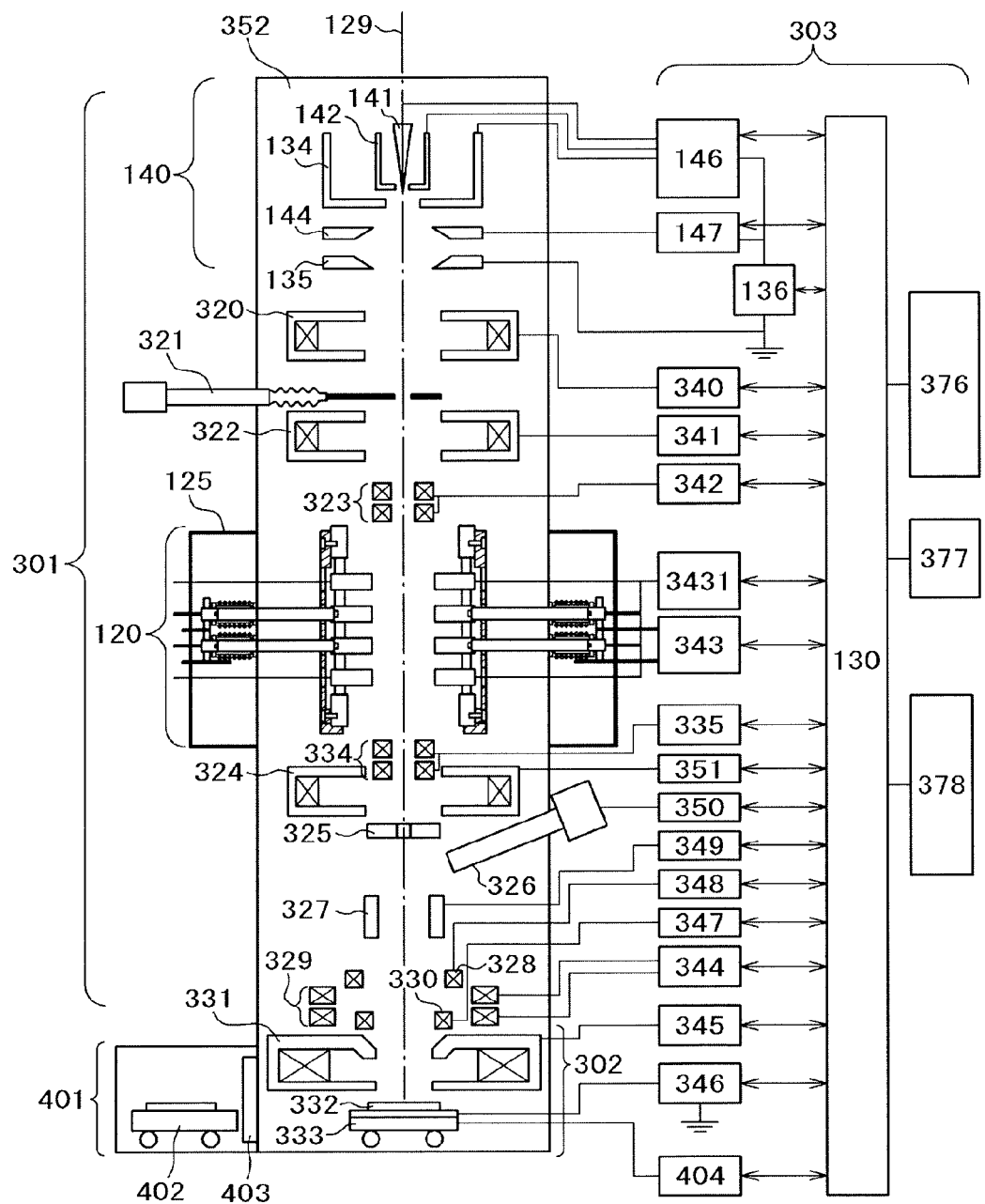
FIG. 9 is a schematic configuration diagram (a partial sectional diagram) illustrating one example of a charged particle beam apparatus (a scanning electron microscope with the chromatic and spherical aberration corrector loaded) according to the second embodiment of the present invention.

FIG. 9 is a schematic diagram illustrating one example of a general configuration of a scanning electron microscope according to the present embodiment with the aberration corrector illustrated in FIG. 8 loaded. Here, in the aberration correction unit in FIG. 8, one example that the rear stage part pole 221 and the outer magnetic path ring 114 have been arranged on the outside of the vacuum container 352 is illustrated. As a result, although it becomes necessary to install a large magnetic shield (a permalloy shield) 125, the coil of a heat generation source is naturally cooled and hence thermal drift of the magnetic pole is reduced. In addition, since it is possible to access the coil, there is such a feature that maintenance such as disconnection repair, winding number changing and so forth of the coil is facilitated. Since the configuration illustrated in FIG. 9 has many parts common to those of the configuration in FIG. 7, only different parts of the structure will be described. In the present embodiment, a Schottky electron gun 140 is used. A Schottky electron source 141 is an electron source that utilizes Schottky effect obtained by diffusing oxygen and zirconium and so forth in a tungsten single crystal, and a suppressor electrode 142 and the extraction electrode 134 are installed in the vicinity of the electron source 141. Schottky electrons are emitted by heating the Schottky electron source 141 and applying a voltage of about +2 kV between the Schottky electron source 141 and the extraction electrode 134. A negative voltage is applied to the suppressor electrode 142 to suppress electron emission from parts other than the tip of the Schottky electron source 141. Although the energy width and the light source diameter are larger than those of the field emission electron gun, many probe currents are obtained, flashing is not necessary and it is suited for continuous operation. Incidentally, reference numeral 144 denotes a first anode, reference numerals 146 and 147 denote electron gun power sources, reference numeral 401 denotes a sample preparation chamber, reference numeral 402 denotes a sample carrier mechanism, reference numeral 403 denotes a gate valve, and reference numeral 404 denotes a sample stage control mechanism.

In the scanning electron microscope of the present embodiment, it is possible to measure a resist pattern and so forth on a semiconductor wafer, and it is used generally by suppressing the landing energy down to not more than about 1 keV from the viewpoint of damage to the sample. In addition, operating conditions, retarding voltage values and so forth of the aberration corrector corresponding to several observation modes that are fixed in working distance and are different from one other in landing energy are stored in the data storage 376, the control computer 130 invokes the selected operating condition in accordance with selection by an operator and executes the observation mode concerned by setting conditions of the respective power sources. The sample chamber 302 includes the sample preparation chamber 401 into which a wafer sample is to be carried, and the wafer sample is set on the sample stage 333 by the sample carrier mechanism 402, passing through the gate valve 403. The control computer 130 controls the sample stage control mechanism 404 to move the stage to a place to be measured that has been input in advance, focuses on the place with the objective lens 331, corrects astigmatism by the astigmatism correction coil 330, and controls the scanning deflector 329, the secondary electron detector 326 and so forth to automatically perform operations such as length measurement, data recording, image acquisition, data storage and so forth. In addition, needless to say, it is also possible to use the magnetic field centric type aberration corrector illustrated in FIG. 3 in place of the aberration corrector illustrated in FIG. 8. In addition, although it depends on the setting condition of the first condenser lens, installation of the second condenser lens 322 may not necessarily be desired.

According to the present embodiment, it is possible to obtain the same advantageous effects as those of the first embodiment. In addition, the coil of the heat generation source is naturally cooled by arranging the rear stage part poles and the outer magnetic path ring to the outside of the vacuum container in the aberration correction unit and thereby it becomes possible to provide the charged particle beam apparatus that is reduced in thermal drift of the magnetic pole.

Third Embodiment

A charged particle beam apparatus according to a third embodiment of the present invention will be described by using FIG. 10. Incidentally, it is also possible to apply the matters described in the first or second embodiment and not described in the present embodiment to the present embodiment unless there are special circumstances.

Figure 10:
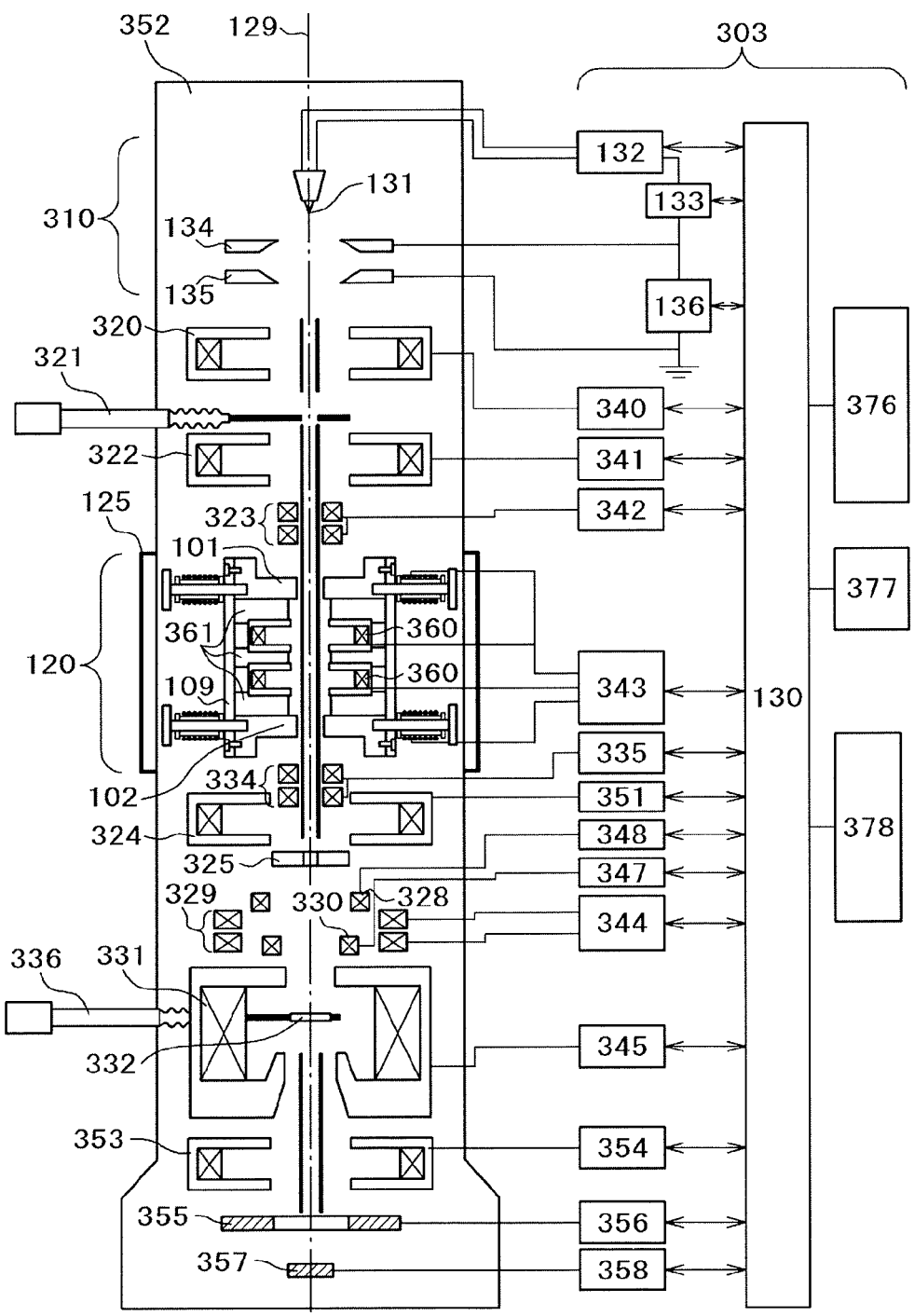
FIG. 10 is a schematic configuration diagram (a partial sectional diagram) illustrating one example of a charged particle beam apparatus (a scanning electron microscope with the chromatic and spherical aberration corrector loaded) according to a third embodiment of the present invention.

FIG. 10 is a schematic diagram illustrating one example of a general configuration of a scanning transmission electron microscope (STEM) according to the present invention. A charged particle optical column for STEM includes the electron gun that generates and emits electron beams at a predetermined acceleration voltage, the scanning deflector 329 that scans the electron beams over the sample, the objective lens 331 adapted to converge the electron beams on the sample and radiate the electron beams to the sample, an annular detector 355 adapted to detect the electron beams transmitted through the sample, an on-axis detector 357 and so forth. Since it is necessary to detect the transmitted electron, it is necessary to slice the sample for STEM and therefore the sample is arranged on the optical axis of the electron beams by a side-entry sample holder 336 in a state of being fixed to a mesh and so forth.

In a high acceleration voltage type STEM, the resolving power is restricted mainly by the spherical aberration rather than by the chromatic aberration, when only the spherical aberration is to be corrected, it is not necessary to use an electromagnetic superimposed pole and a magnetic field type multipole is used in every respect. The spherical aberration corrector for STEM is arranged between, for example, an electron gun and an objective lens. The aberration corrector 120 of the present embodiment is a spherical aberration corrector of a configuration that hexapoles (or twelve-fold poles) are arranged on upper and lower parts and two stages of transfer lenses 360 are arranged between these poles. Positioning of the upper and lower poles is performed by fitting the poles 101 and 102 into the square grooves in the cylindrical housing 109 as described above. The positions of two transfer lenses 360 are determined using three spacers 361. A square projection that fits into the square groove in the cylindrical housing 109 is formed on each spacer 361 and therefore assembling is readily performed. Also in the present embodiment, although it depends on the setting condition of the first condenser lens, installation of the second condenser lens may not necessarily be desired. Incidentally, reference numeral 353 denotes a projection lens, reference numeral 354 denotes a projection lens power source, reference numeral 356 denotes an annular detector power source and reference numeral 358 denotes an on-axis detector power source.

According to the present embodiment, it is possible to obtain the same advantageous effects as those of the first embodiment.

Incidentally, the present invention is not limited to the above-mentioned embodiments and includes various modified examples. For example, the above-mentioned embodiments have been described in detail for easy understanding of the present invention and are not necessarily limited to the one including all of the configurations described above. In addition, a part of one configuration of one embodiment may be replaced with one configuration of another embodiment and one configuration of another embodiment may be added to one configuration of one embodiment. Still further, another configuration may be added to, deleted from and/or replaced with a part of one configuration of each embodiment.

What is claimed is:

1. An aberration corrector, comprising:
   a plurality of magnetic field type poles;
   a ring that magnetically connects the plurality of poles with one another, and
   an adjustment member disposed between the pole and the ring to adjust a spacing between the pole and the ring per pole.

2. The aberration corrector according to claim 1, wherein "between the pole and the ring" is "between a side face of a groove or a hole formed in the ring so as to contain an end of the pole and a side face of the end of the pole".

3. The aberration corrector according to claim 1, wherein the adjustment member is a tapered spacer disposed between the end of the pole and the ring.

4. The aberration corrector according to claim 1, wherein the adjustment member is a fixture that fixes the pole and the ring with a non-magnetic body.

5. The aberration corrector according to claim 1, wherein the adjustment member is a fixture that fixes the pole and the ring with screws made of a non-magnetic body at a plurality of places.

6. The aberration corrector according to claim 1,
   wherein "between the pole and the ring" is "between a side face of a groove or a hole formed in the ring so as to contain an end of the pole and a side face of the end of the pole", and
   the adjustment member is a spacer to be interposed between facing side faces of the pole and the ring so as to make the spacing uniform.

7. The aberration corrector according to claim 1, wherein the adjustment member adjusts a spacing between the pole and the ring such that magnetic characteristics of tips of the respective poles mutually match among the plurality of poles.

8. The aberration corrector according to claim 1, wherein the aberration corrector corrects a chromatic or spherical aberration.

9. The aberration corrector according to claim 1, further comprising:
   a pole member that the plurality of poles have been formed integrally with a support; and
   a cylindrical housing having an opening through which charged particle beams pass in a central part,
   wherein the cylindrical housing includes a plurality of grooves into which the plurality of poles are to be fitted and fixed on a circumference of an inner wall of the opening.

10. The aberration corrector according to claim 1, wherein the pole is configured by using a soft magnetic metal material, or the soft magnetic metal material and a non-magnetic metal material.

11. The aberration corrector according to claim 9, wherein the support is made of an alumina material, and
   the pole is fixed to the support by brazing.

12. The aberration corrector according to claim 1, wherein the aberration corrector uses a multi-stage multipole of four or more stages.

13. A charged particle beam apparatus, comprising:
   the aberration corrector according to claim 1,
   wherein a tip part of the pole of the aberration corrector is housed in a vacuum chamber.

14. A charged particle beam apparatus, comprising:
   the aberration corrector according to claim 1,
   wherein the aberration corrector includes a multi-stage multipole of four or more stages.

15. A charged particle beam apparatus, comprising:
   a sample stage:
   a charged particle source that generates charged particles to be radiated to a sample to be placed on the sample stage;
   a charged particle beam optical system that radiates the charged particles to the sample as a particle beam, and
   an aberration corrector adapted to correct an aberration of the particle beam, the aberration corrector including a plurality of magnetic field type poles, a ring that magnetically connects the plurality of poles with one another and an adjustment member disposed between the pole and the ring to adjust a spacing between the pole and the ring per pole.

* * * * *